(12) United States Patent
Cobley

(10) Patent No.: US 6,952,135 B2
(45) Date of Patent: Oct. 4, 2005

(54) METHOD AND APPARATUS FOR CONTROLLING AN AMPLIFIER

(75) Inventor: Kevin Cobley, Salisbury (GB)

(73) Assignee: Roke Manor Research Limited, Romsey (GB)

(*) Notice: Subject to any disclaimer, the term of this patent is extended or adjusted under 35 U.S.C. 154(b) by 0 days.

(21) Appl. No.: 10/381,975
(22) PCT Filed: Oct. 25, 2001
(86) PCT No.: PCT/GB01/04728
§ 371 (c)(1), (2), (4) Date: Jul. 24, 2003
(87) PCT Pub. No.: WO02/37668
PCT Pub. Date: May 10, 2002

(65) Prior Publication Data
US 2004/0100326 A1 May 27, 2004

(30) Foreign Application Priority Data
Oct. 31, 2000 (GB) .............................. 0026579

(51) Int. Cl.$^7$ .............................................. H03G 3/30
(52) U.S. Cl. ....................................... 330/279; 330/129
(58) Field of Search ................................ 330/127, 129, 330/130, 138, 279, 280; 455/126

(56) References Cited

U.S. PATENT DOCUMENTS

| | | | |
|---|---|---|---|
| 4,063,033 A | 12/1977 | Harbert et al. | ............ 381/94.1 |
| 4,165,493 A | 8/1979 | Harrington | .............. 330/207 P |
| 4,370,622 A | 1/1983 | Hornbeck et al. | ....... 330/207 P |
| 5,214,393 A | * 5/1993 | Aihara | ........................ 330/279 |
| 5,459,426 A | * 10/1995 | Hori | .......................... 455/126 |
| 5,604,924 A | * 2/1997 | Yokoya | ...................... 330/279 |
| 5,656,972 A | * 8/1997 | Norimatsu | .................. 330/279 |

FOREIGN PATENT DOCUMENTS

EP  0 594 358 A  4/1994

* cited by examiner

Primary Examiner—Khanh V. Nguyen
(74) Attorney, Agent, or Firm—Crowell & Moring LLP

(57) ABSTRACT

A method and apparatus are described for controlling the operation of an amplifier, in which, a bias level applied to the amplifier is adjusted so as to generate an output signal having the desired level of peak to mean ratio.

20 Claims, 2 Drawing Sheets

METHOD AND APPARATUS FOR CONTROLLING AN AMPLIFIER

BACKGROUND OF THE INVENTION

The present invention relates to methods and apparatus for controlling an amplifier according to an envelope ratio of a signal, and apparatus and methods for determining the peak-to-mean envelope ratio of a signal. In particular, the present invention may be applied to radio frequency (RF) signals such as used in the UMTS system.

RF transmissions from mobile telephones of the present generation typically have a constant envelope shape, and the RF amplifiers operate with constant power. However, in the next generation of mobile telephones, it is intended to operate RF transmissions with a variable envelope. It would be possible to continuously operate the RF amplifier at a high power, sufficient to generate the largest signal output. For example, it would be possible to operate an amplifier at a bias providing a 1 W output capability despite a current output requirement of only 1 mW output power, in order to be capable of providing a 1 W output power when required. However, that would be wasteful of power, as a high standby current (bias) would need to be applied to the RF amplifier at all times. Mobile telephones are typically operated using rechargeable batteries. It is required for the mobile telephone to operate for as long as possible, both in standby and operating modes, from a single battery charge. Therefore, the power consumption of the mobile telephone should be reduced as much as possible.

Some attempts have been made to adapt the bias (standby power consumption) according to the instantaneous value of the output signal envelope. While this would reduce the power consumption of the amplifier, and extend battery life, it has not been found possible to track rapid changes in envelope fast enough to allow efficient RF transmission.

SUMMARY OF THE INVENTION

It is therefore required to provide a method and apparatus for efficiently determining and controlling the power consumption of an amplifier. In an RF system, the transmitter is likely to operate at relatively low output power, due to the statistical distribution of power output in real networks. It is accordingly preferred that the method and apparatus be particularly low in power consumption at relatively low output powers.

According to an aspect of the present invention, a method for controlling the operation of an amplifier comprises the steps of: measuring a characteristic of an output signal of the amplifier; measuring a peak value of the characteristic; measuring a time-averaged mean value of the characteristic; comparing the peak value to the mean value; providing a demand signal representing a required value of the peak to mean comparison; and adjusting a bias level applied to the amplifier so as to generate an output signal having the desired level of the peak to mean comparison.

According to an embodiment of the invention, a peak-to-mean envelope ratio of the signal is determined. The mean value is calculated over a relatively lengthy period of time, while peak values are detected and held, again for a relatively lengthy period of time. Therefore, the peak-to-mean value of the signal changes relatively slowly as compared to the rate of change of the envelope itself.

The present invention therefore provides a peak to mean ratio detector; apparatus for controlling an amplifier, comprising such peak detector; a method for controlling an amplifier; and a method for obtaining a peak envelope to mean envelope ratio.

In particular, according to an aspect of the present invention, a method for controlling an amplifier comprises the steps of: detecting an output power envelope of a signal from the amplifier; deriving a first value, indicative of the output power envelope; and deriving second and third values, respectively indicative of a mean value, and a peak value, of the first value. The second value is subtracted from the third value, to obtain a difference value. A demand signal is supplied and compared to the difference value, to derive a bias signal. The amplifier is controlled according to the bias signal, to achieve a desired peak envelope to mean envelope ratio in the output signal of the amplifier.

In an embodiment of the present invention, the first value is a logarithmic representation of the output power envelope; the second and third values are respectively mean and peak values of the logarithmic representation of the output power envelope, and the demand signal is adapted to operate with the difference value to produce the required adjustment to the bias signal, to control the amplifier as required.

In an embodiment of the present invention, the first value is a linear representation of the output power envelope; the second and third values are respectively linear representations of mean and peak values of the first value, the difference value is a linear representation of the difference between peak and mean values of the output power envelope; and the demand signal is adapted to operate with the difference value to produce the required adjustment to the bias signal, to control the amplifier as required.

In an embodiment of the present invention, the first value is a linear representation of the output power envelope; the second and third values are respectively logarithmic representations of mean and peak values of the first value, the difference value is a logarithmic representation of the ratio of the peak value of the output power envelope to the mean value of the output power envelope; and the demand signal is adapted to operate with the difference value to produce the required adjustment to the bias signal, to control the amplifier as required.

In an embodiment of the present invention, the first value is an arbitrary polynomial representation of the output power envelope; the second and third values are respectively mean, and peak, values of the first value, and the demand signal is adapted to operate with the difference value to produce the required adjustment to the bias signal, to control the amplifier as required.

The third value may be obtained by passing a signal representing the first value in succession through a low pass filter and a peak detector.

The second value may be obtained by applying a signal representing the first value through an integrator.

The step of detecting an output power envelope of the signal from the amplifier may comprise the step of down-conversion prior to detection.

According to a further aspect of the present invention, apparatus for controlling an amplifier to achieve a desired peak envelope to mean envelope ratio in the output signal of the amplifier, comprises a detector for deriving a first value, representative of an output power envelope of a signal from the amplifier; a peak detector for detecting a peak value of the first value; an averaging means for detecting a mean value of the first value. A first subtracter is provided for subtracting the mean value from the peak value, to obtain a difference value. A second subtracter is provided for subtracting the difference value from a demand signal to produce a bias signal. An input to the amplifier is provided for receiving the bias signal, to control the amplifier according to the difference between the difference value and the demand signal, so as to achieve a required peak-to-mean ratio of the output signal.

The detector may be a logarithmic detector, the first value may be a logarithmic representation of the output power envelope, and the demand signal may be adapted to operate with the difference value to produce the required adjustment to the bias signal, to control the amplifier as required.

Alternatively, the detector may be a linear detector, the first value may be a linear representation of the output power envelope, and the demand signal may be adapted to operate with the difference value to produce the required adjustment to the bias signal, to control the amplifier as required. In this case, the difference value may represent the difference between the peak value of the output power envelope and the mean value of the output power envelope.

Alternatively, the detector may be a linear detector and the first value may be a linear representation of the output power envelope. Logarithmic converters may be provided for converting the peak value and the mean value into logarithmic representations. In this case, the demand signal is adapted to operate with the difference value to produce the required adjustment to the bias signal, to control the amplifier as required. The difference value will represent the logarithm of the ratio between the peak value of the output power envelope and the mean value of the output power envelope.

Alternatively, the detector may be an arbitrary polynomial detector, and the first value may be a corresponding arbitrary polynomial representation of the output power envelope. In this case, the demand signal will be adapted to operate with the difference value to produce the required adjustment to the bias signal, to control the amplifier as required.

In any such apparatus, the peak value may be obtained by passing a signal representing the first value in succession through a low pass filter and a peak detector. The mean value may be obtained by applying a signal representing the first value through an integrator.

A downconverter may additionally be provided for downconverting the signal prior to detection of the output power envelope.

In certain embodiments of the invention, the amplifier is an RF amplifier.

According to a further aspect of the present invention, a method for obtaining a peak envelope to mean envelope ratio measurement of a first signal comprises the steps of: deriving a second signal indicative of the envelope of the first signal; deriving a third signal, indicative of the mean of the second signal; deriving a fourth signal, indicative of a peak value of the second signal; and subtracting the third signal from the fourth signal, to derive a fifth signal, indicative of the peak envelope to mean envelope ratio of the signal.

In such a method, the second signal may represent a logarithm of the envelope of the first signal, and the fifth signal may represent a logarithm of the peak envelope to mean envelope ratio of the first signal.

The signals may be transmitted as electrical or optical signals. The signals may be transmitted as analogue levels, or may be digitally encoded, or may be pulse-modulated waveforms.

The above, and further, objects, characteristics and advantages of the present invention will become more apparent with reference to the following description of certain embodiments thereof, given by way of examples only, in conjunction with the accompanying drawings.

DETAILED DESCRIPTION OF THE INVENTION

In some radio frequency systems, such as the UMTS system, it is necessary to provide a signal with a desired peak-to-mean envelope ratio. In order to achieve a higher data rate from a given bandwidth of the RF spectrum, it is necessary to employ a signal with a non-constant envelope, giving rise to a high peak-to-mean ratio.

In order to generate RF signals with a varying envelope, linear power amplifiers are required, and these may be set up to provide some level of clipping to the output signal. Allowing some degree of clipping allows the amplifier to operate at lower power consumption, giving increased battery life.

Linear power amplifiers are known, having a bias input, which sets the bias point, which in turn determines the current consumption and so also the maximum output power. A low bias leads to a low peak output power. Gain is also affected by bias but less strongly, thus affecting the mean output power.

Figure 1A:
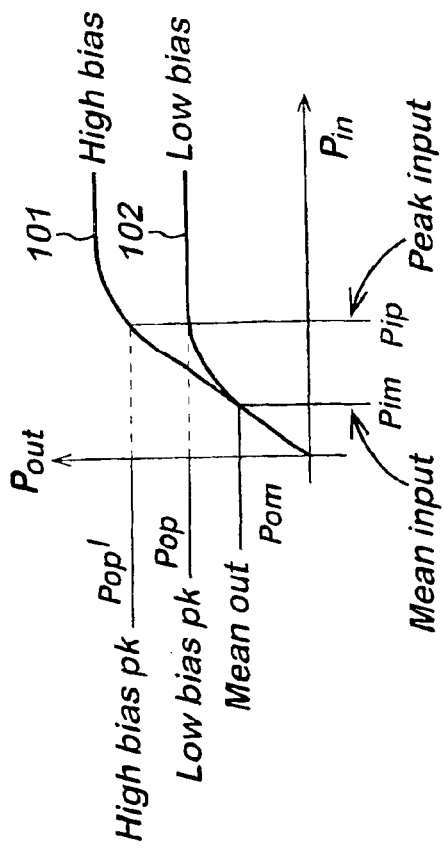
FIG. 1A represents an input power to output power relationship for a typical linear amplifier.

Linear amplifiers are only linear up to a compression point, which is affected by the bias. FIG. 1A shows the relationship between output power Pout and input power Pin for a linear amplifier with various bias points. Curve 101 illustrates the output power to input power relationship for a linear amplifier operated at a relatively high bias, while the curve 102 illustrates a corresponding relationship for the same amplifier operated at a lower bias. Mean input power Pim and mean output power Pom values are shown, along with a peak input power Pip, and corresponding peak output values Pop, Pop' for low and high bias cases, respectively. In the low bias case 102, the peak-to-mean ratio (Pop/Pom) is reduced by compression in the amplifier. The high bias point 101 should then be chosen to provide a higher peak-to-mean ratio (Pop'/Pom), and to preserve the integrity of the input signal. However, if the magnitude of the input signal (Pim, and particularly Pip) is reduced, the lower bias 102 would suffice. Current would be wasted if the high bias 101 is chosen to cope with input signels of greater magnitude than necessary.

A required peak-to-mean ratio should be chosen such that the resultant signal may be clipped, sufficiently to achieve maximum efficiency, while not being so far clipped that spectral spillage limits are exceeded. By selecting a peak to mean ratio, the amplifier bias may be set to provide just enough capability to amplify an input signal to an output signal with a certain level of clipping, that is, to operate at an optimal power consumption whatever the level of input signal.

According to an aspect of the present invention, a peak-to-mean value of the envelope of the output signal is measured, using a mean value obtained over a relatively long period of time, while the peak values are detected and held over a relatively long period of time. Therefore, the peak-to-mean values determined according to the methods and apparatus of the present invention vary relatively slowly.

The methods and apparatus of the present invention do not attempt to vary the bias level of the amplifier according to real-time variations of the RF signal.

It is therefore possible that the amplifier bias is excessive for a time, following an abrupt reduction in envelope size, or the envelope bias may be undervalued for a time, following an abrupt increase in envelope size. However, the operation has been found to be satisfactory, with significant reductions in power consumption being achieved. The apparatus and method of the present invention may provide for resetting of variables if an abrupt change is to be made to the level of the input signal to the amplifier.

The present invention particularly relates to an efficient way of determining the peak-to-mean ratio of a signal envelope, and an amplifier controller using the peak-to-mean ratio detector.

The peak to mean detector of the present invention is a system concept that allows the bias of a linear power amplifier to be set to produce a demanded peak to mean ratio of the signal at the output of the amplifier. This allows the overall system to minimise its power consumption. The sought peak-to-mean ratio control is a long-term control servo that varies the bias based on the history of the output signal. It does not aim to control at the modulation rate, and is therefore equally applicable to narrowband and wideband modulation schemes.

The most important part of the apparatus of the present invention is the peak-to-mean ratio detector. This is a circuit which can estimate the peak and mean envelopes of the output signal, and generate a ratioed output that can act as a measurement of the peak to mean value of the output signal which is used to control the amplifier.

As is widely recognized, the operation of mathematical division is difficult in electronic or other control circuits, whereas processes of addition and subtraction are relatively easy. Therefore, according to one aspect of the present invention, there is provided a method for obtaining the peak-to-mean ratio without performing a division operation.

According to certain embodiments of the present invention, the mathematical operation that logarithm of the ratio of two quantities can be expressed as a subtraction of the logarithms of the two quantities, is used:

$$\log_x(A/B) = \log_x(A) - \log_x(B).$$

Therefore, the logarithm of the peak-to-mean envelope is equal to the difference between the logarithm of the peak value of the envelope and the logarithm of the mean value of the envelope.

Figure 2:
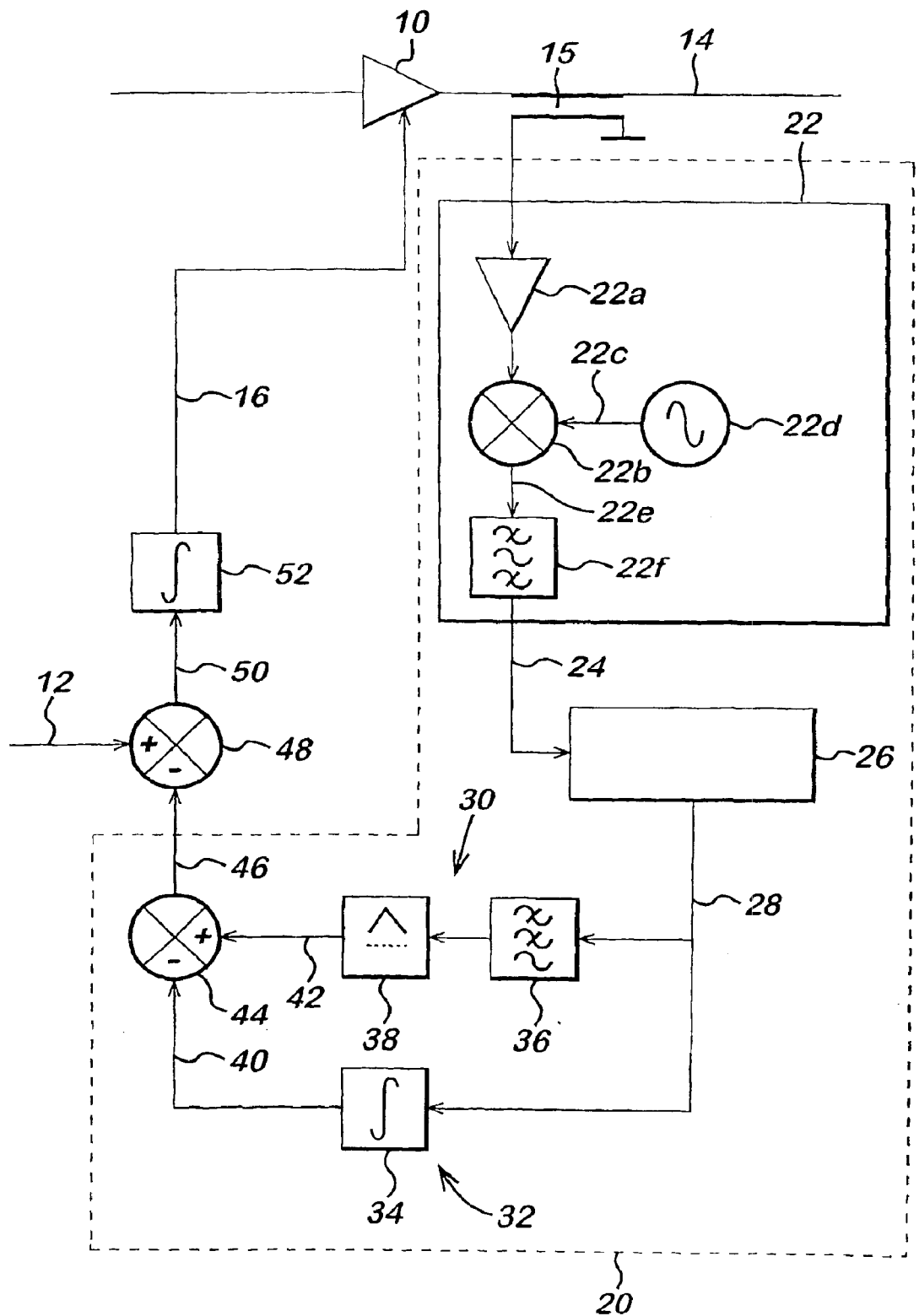
FIG. 2 represents apparatus for controlling an amplifier according to the present invention, incorporating a peak to mean detector according to the present invention, operable according to the method of the present invention.

Referring now to FIG. 2 of the drawings, a linear power amplifier 10 is to be set by a bias signal 16, determined according to an input signal 12 representing a demanded peak to mean ratio, to be applied to the output signal 14. The demanded ratio is determined by consideration of the level of clipping that is acceptable. This is easily simulated or measured in the design of the apparatus and should be only a function of the number of channels being generated by the transmitter. There is always one pilot channel and one data/voice channel in UMTS as a minimum. If more data channels are added, the peak/mean increases and a different demanded peak-to-mean ratio is needed. The criterion for the output peak-to-mean ratio is that the output signal meets the relevant spectral requirements and also the "vector error magnitude" or modulation accuracy requirements. A sampling device 15, such as a coupler, directional coupler or resistive tap, diverts some of the output signal energy from the amplifier into a peak-to-mean detector 20 of the present invention. A downconverter 22 may be provided, depending on the frequency of the output signal 14, to convert the signal 14 into a signal 24 of more appropriate frequency.

The downconverter 22, where provided, may comprise an isolation amplifier 22a, supplying a signal to a mixer 22b. The mixer 22b may also receive a local oscillator signal 22c from local oscillator 22d to provide a mixed signal 22e, which is then passed through a band pass filter 22f of the required frequency band.

The output of the downconverter, or the output of the amplifier, if of suitable frequency, is then applied to a logamp detector 26. This provides a signal 28 representative of the logarithm of the envelope of the signal 14. Suitable logamp detectors are known, for example, as used in spectrum analysers and radar receivers.

The signal 28 is then applied to a peak detecting means 30 and to an averaging means 32, in parallel. The averaging means includes an integrator 34, which receives the signal 28 and outputs a value 40 representing the mean value of the logarithm of the envelope of the signal 14. The peak detecting means typically comprises a low pass filter 36 and a peak detector 38, connected in series in that order.

Figure 1B:
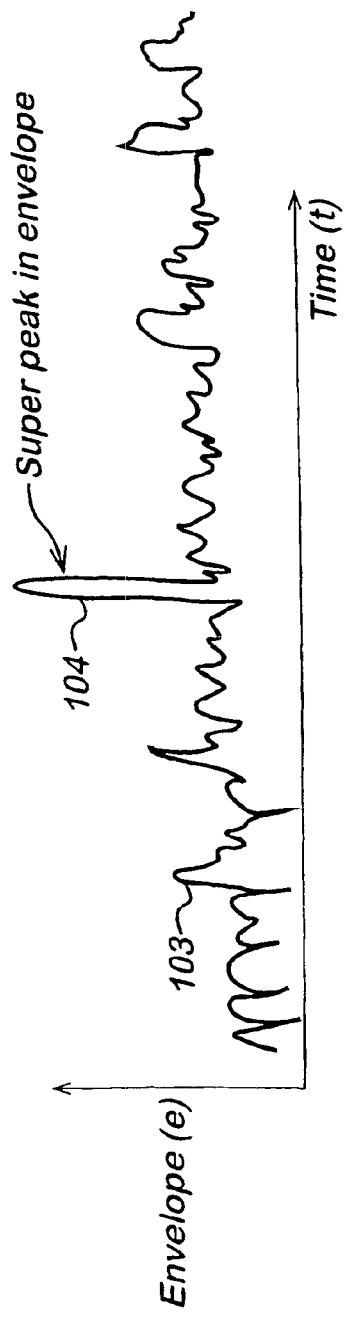
FIG. 1B represents a typical envelope waveform.

FIG. 1B illustrates an example in the value of the envelope e with time t. Curve 103 illustrates a typical variation of envelope with time, and peak values can be seen, while a mean value could be estimated. In the envelope waveform 103, so-called "super peaks" 104 may occur, ie peak envelope values much higher than the normal peak envelope values. These are comparatively rare, have a very fast rise time and are narrow. Because they are rare, it is perfectly possible and usually acceptable to clip them, without degrading performance. The low pass filter 36 serves to filter off the size of these narrow peaks (clip the super peaks), thereby preventing the overloading of the peak detector 38.

As a subsidiary function, the low pass filter is preferably also adapted to eliminate high frequency, e.g. RF, components, to pass only the envelope to peak detector 38.

The peak detector 38 then detects a maximum value of the envelope of the input signal 28, and holds that value as its output signal 42. The peak detector holds this value for a relatively lengthy period of time. The decay rate of the peak detector should be as slow as possible, while still providing detection of the majority of peaks within the envelope of signal 14. In a typical RF signal for mobile telephony applications, peak values may last only 10 ns or so, while the decay rate should be set slow enough to retain the peak value for several milliseconds, a similar time to that used for averaging in the mean detector 34.

The signal 40 (representing the mean value of the logarithm of the envelope of the signal 14), and the signal 42 (representing the maximum value of the logarithm of the envelope of the signal 14) are then applied to a subtracter 44, which subtracts the value of signal 40 from the value of signal 42, and provides a difference signal 46, representing the logarithm of the peak to mean value of the envelope of signal 14.

A second subtracter 48 receives the difference signal 46 and subtracts it from the demand signal 12, which it also receives. The difference between the two signals is output as an error signal 50. The error signal 50 is preferably, although not necessarily, then applied to a smoothing circuit (integrator 52), before being used as the bias control signal 16. The integrator 52 is there to define the control characteristics, thereby assuring that the loop settles with zero error with a non-overshooting response.

In the above described embodiment, a logarithmic detector 26 is used, that is, the envelope value is detected, and its logarithm derived at the same time, to directly produce an output signal 28 which is representative of the logarithm of the envelope. The output 46 of subtracter 44 therefore represents the difference between the peak of the logarithm of the envelope, and the mean of the logarithm of the envelope. The mean of the logarithm of the envelope is slightly different from the logarithm of the mean of the envelope, and so the value of the signal 46 will not exactly represent the logarithm of the mean of the envelope. However, this difference may be compensated for by varying the values of the demand signal 12 applied to request a certain peak-to-mean ratio.

In alternative embodiments, the envelope detection function may be separated from the logarithm derivation. For example, a diode detector may be used to provide a linear indication of the envelope, with a logarithmic converter applied later. The logarithmic converter may be placed between the diode detector and the peak and mean detectors. Individual logarithmic converters may be provided for each detector, or a single logarithmic converter may provide a single output that is directed to both peak and mean detectors. In further alternative embodiments, individual logarithmic converters may be placed after each of the peak and mean detectors, to convert linear values of peak and mean into logarithmic values. In these embodiments, the signal 46 produced by the subtracter 44 will represent the actual logarithm of the peak-to-mean ratio.

In yet further embodiments of the present invention, logarithmic conversion may be avoided altogether. For example, diode conversion may be used directly with a peak detector and a mean detector, and peak and mean envelope values applied to the subtracter. The signal 46 supplied by the subtracter will no longer represent the peak to mean ratio, but will rather represent a difference between peak value and mean value.

The principles of the present invention apply whether the difference signal 46 produced by the subtracter represents a logarithm of the peak to mean ratio, or a difference of the logarithms of the peak and mean values, or a difference of some other function. The demand signal 12 applied to second subtracter 48 must be adapted to correspond to the type of difference signal in use.

For example, the demand signal 12 may represent the logarithm of the required peak-to-mean envelope, to allow a direct comparison with the difference signal 46. Alternatively, a linear demand signal may be provided to a logarithmic converter (not shown) before being applied 12 to the subtracter 48. A further alternative would be to convert the difference signal 46 into a linear signal before applying it to the subtracter 48, and using a linear demand signal 12.

Some logarithmic converters, such as the logamps referred to earlier, may be difficult to stabilise in temperature. When used to derive the envelope, temperature stabilisation is not important as differential pairs are used, and are relatively immune to temperature variation. However, when used as a standalone logarithmic converter, temperature stabilisation becomes important.

In a second, alternative, embodiment the peak detection means 30 and the averaging means 32 each include a logamp detector, similar to that indicated at 26, placed upstream of the components illustrated in the drawing. Logamp converter 26 would not then be required.

In a third embodiment, the logamp detectors referred to in respect of the second embodiment are located downstream of the respective components illustrated in the drawing. In this embodiment, the subtracter is supplied with the logarithm of the mean of the envelope, and the logarithm of the peak of the envelope, whereas in the other embodiments, the subtracter is supplied with the mean of the logarithm of the envelope, and the peak of the logarithm of the envelope. In such an embodiment, the value of the demand signal 12 has to be chosen correctly. It should be related to the logarithm of the difference rather than the simple difference of the logarithms. This is still just a simple voltage. There is a slight increase in sensitivity to the demand input in this case, since the error voltage is smaller.

While the present invention has been described with reference to a limited number of particular embodiments, various modifications and adjustments may be made within the scope of the present invention. For example, although the present invention is particularly applicable to RF signals, it may be applied without substantial modification to signals of other wavelengths.

The preceding description refers only to "logarithms", the present invention will perform equally well using logarithms to base 10, base e, base 2, base 16 or any other base. For this reason, the formula recited above is expressed in logarithms to base x. As discussed earlier, the present invention may also be applied to arrangements not having a logarithmic function.

The signals referred to above may be embodied as electrical, optical, mechanical or other suitable signals in a circuit designed to respond to such signals. The signals may be expressed as an analogue value (e.g. a steady voltage, a steady light intensity, a steady pressure), or by a digital coding of some sort (e.g. hexadecimal numbering) or a pulse code system (e.g. where the value expressed is related to the instantaneous frequency of digital impulses). It may be necessary to convert between types of signal for processing (e.g. optical or mechanical signals 14 may need to be converted into electrical signals before they can be processed).

The forgoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for controlling the operation of an amplifier, comprising the steps of:
   measuring a characteristic of an output signal of the amplifier;
   measuring a peak value of the characteristic;
   measuring a time-averaged mean value of the characteristic;
   comparing the peak value to the mean value;
   providing a demand signal representing a required value of the peak to mean comparison; and
   adjusting a bias level applied to the amplifier so as to generate an output signal having the desired level of the peak to mean comparison.

2. A method for controlling an amplifier (10) according to claim 1, comprising the steps of:
   detecting an output power envelope of a signal from the amplifier;
   deriving a first value, indicative of the output power envelope;
   deriving second and third values, respectively indicative of a mean value, and a peak value, of the first value;
   subtracting the second value from the third value, to obtain a difference value;

supplying a demand signal and comparing it to the difference value, to derive a bias signal; and controlling the amplifier according to the bias signal, to achieve a desired peak envelope to mean envelope ratio in the output signal of the amplifier.

3. A method according to claim 2, wherein the first value is a logarithmic representation of the output power envelope; the second and third values are respectively mean and peak values of the logarithmic representation of the output power envelope, and the demand signal is adapted to operate with the difference value to produce the required adjustment to the bias signal, to control the amplifier as required.

4. A method according to claim 2, wherein the first value is a linear representation of the output power envelope; the second and third values are respectively linear representations of mean and peak values of the first value, the difference value is a linear representation of the difference between peak and mean values of the output power envelope; and the demand signal is adapted to operate with the difference value to produce the required adjustment to the bias signal, to control the amplifier as required.

5. A method according to claim 2, wherein the first value is a linear representation of the output power envelope; the second and third values are respectively logarithmic representations of mean and peak values of the first value, the difference value is a logarithmic representation of the ratio of the peak value of the output power envelope to the mean value of the output power envelope; and the demand signal is adapted to operate with the difference value to produce the required adjustment to the bias signal, to control the amplifier as required.

6. A method according to claim 2, wherein the first value is an arbitrary polynomial representation of the output power envelope; the second and third values are respectively mean, and peak, values of the first value, and the demand signal is adapted to operate with the difference value to produce the required adjustment to the bias signal, to control the amplifier as required.

7. A method according to claim 2, wherein the third value is obtained by passing a signal representing the first value in succession through a low pass filter and a peak detector.

8. A method according to claim 2, wherein the second value is obtained by applying a signal representing the first value through an integrator.

9. A method according to claim 2, wherein the step of detecting an output power envelope of the signal from the amplifier comprises the step of downconversion prior to detection.

10. A method or Apparatus according to claim 1, wherein the amplifier is an RF amplifier.

11. A method or apparatus according to claim 1, wherein the signals are transmitted as electrical or optical signals.

12. A method or an apparatus according to claim 1, wherein the signals are transmitted as analogue levels, or are digitally encoded, or are pulse modulated waveforms.

13. Apparatus for controlling an amplifier to achieve a desired peak envelope to mean envelope ratio in the output signal of such amplifier comprising:

a detector generating for a first value, representative of an output power envelope of a signal from such amplifier;

a peak detector for determining a peak value of the first value;

an averaging means for determining a mean value of the first value;

a subtracter for subtracting the mean value from the peak value, to obtain a difference value;

a subtracter for subtracting the difference value from a demand signal to produce a bias signal for controlling such amplifier according to the difference between the difference value and the demand signal, so as to achieve a required peak-to-mean ratio of the output signal.

14. Apparatus according to claim 13, wherein the detector is a logarithmic detector, the first value is a logarithmic representation of the output power envelope, and the demand signal is adapted to operate with the difference value to produce the required adjustment to the bias signal, to control the amplifier as required.

15. Apparatus according 13, wherein the detector is a linear detector, the first value is a linear representation of the output power envelope, and the demand signal is adapted to operate with the difference value to produce the required adjustment to the bias signal, to control the amplifier as required, wherein the difference value represents the difference between the peak value of the output power envelope and the mean value of the output power envelope.

16. Apparatus according to claim 13, wherein the detector is a linear detector and the first value is a linear representation of the output power envelope, and wherein logarithmic converters are provided for converting the peak value and the mean value into logarithmic representations and wherein the demand signal is adapted to operate with the difference value to produce the required adjustment to the bias signal, to control the amplifier as required, wherein the difference value represents the logarithm of the ratio between the peak value of the output power envelope and the mean value of the output power envelope.

17. Apparatus according to claim 13, wherein the detector is an arbitrary polynomial detector, the first value is a corresponding arbitrary polynomial representation of the output power envelope, and the demand signal is adapted to operate with the difference value to produce the required adjustment to the bias signal, to control the amplifier as required.

18. Apparatus according to claim 13, wherein the peak value is obtained by passing a signal representing the first value in succession through a low pass filter and a peak detector.

19. Apparatus according to claim 17, wherein the mean value is obtained by applying a signal representing the first value through an integrator.

20. Apparatus according to claim 13, wherein a downconverter is provided for downconverting the signal prior to detection of the output power envelope.

* * * * *